March 15, 1966 R. A. BECK 3,240,624

METHOD OF FORMING A PATTERNED ELECTROCONDUCTIVE COATING

Filed March 7, 1962

INVENTOR.
RONALD A. BECK
BY
Clarence R. Patty, Jr.
ATTORNEY

United States Patent Office 3,240,624
Patented Mar. 15, 1966

3,240,624
METHOD OF FORMING A PATTERNED ELECTROCONDUCTIVE COATING

Ronald A. Beck, Lewis Run, Pa., assignor to Corning Glass Works, Corning, N.Y., a corporation of New York Filed Mar. 7, 1962, Ser. No. 178,149
7 Claims. (Cl. 117—212)

This invention relates to a method for forming electroconductive patterns on substantially non-conductive substrates and more particularly to a method of forming thin wafer resistors, but is in no way limited to such applications.

Resistors, heaters, conductors, printed circuits and the like are formed of patterned resistive or electroconductive coatings applied to non-conductive substrates such as glass, ceramics, plastics and the like. In applications where electroconductive coatings are applied by evaporating, fuming or other hot processes, it is difficult to apply patterned coatings directly, therefore, continuous coatings are applied which are thereafter patterned. One such method entails placing a separately formed, unattached mask over the continuous coating, said mask having the desired pattern and then sandblasting the electroconductive coating off of the substrate around said mask. It has been found that such a mask is difficult to make accurately and is difficult to hold in place. Since it is merely held in place some undercutting of the coating takes place causing the resulting pattern to have uneven edges thereby affecting its electrical properties. In addition, such masks can only be used for a few pieces and thereafter become damaged by the repeated sandblasting.

Other methods such as etching, electric burning and the like have been used, but have been found unsatisfactory where the object is small, the substrate surface is not smooth, and the pattern lines are thin and require good definition.

Furthermore, it has been found difficult to economically produce small objects having patterned electroconductive coatings where the pattern line width or the spacing between such lines is small.

It is the specific object of this invention to provide a method for forming patterned electroconductive coatings on surfaces of vitreous or other non-conductive materials where the above disadvantages are overcome.

It is another object of this invention to provide an improved method for forming patterned electroconductive coatings where the pattern lines are thin.

A further object is to provide a method for forming a patterned electroconductive coating which has smooth pattern line edges.

Still another object is to provide an economical method for removing unwanted portions of an electroconductive coating through sandblasting.

A still further object is to provide an improved sandblasting mask.

Still another object is to provide an improved method for sandblasting where the sandblasting mask is adhered to the surface being treated.

A still further object is to provide a method for forming patterned coatings or decorative patterns on a substrate.

Additional objects, features and advantages of the present invention will become apparent, to those skilled in the art, from the following detailed description and the attached drawing, on which, by way of example, only the preferred embodiments of this invention are illustrated.

I have found that such objects can be achieved by forming a continuous electroconductive coating upon a suitable non-conductive substrate, precatalyzing the unit so formed, applying to said coating an adherent, resilient mask of an uncatalyzed synthetic rubber corresponding in shape to the configuration of the desired electroconductive coating pattern, thereby leaving a portion of said coating which surrounds said mask uncovered, removing the uncovered electroconductive coating by sandblasting the surface, said mask preventing the removal of that portion of said coating which is covered by it, and thereafter removing said mask.

Any electroconductive coating material, which can be applied to thin films or coatings is suitable for the present purpose. Such films or coatings are generally composed of metallic and/or metallic oxide compositions and may have various fillers, binders and the like. For one example of a suitable film, its characteristics and method of application, reference is made to U.S. Patent No. 2,564,706 issued to John M. Mochel and assigned to the same assignee of the instant application.

Figure 1:
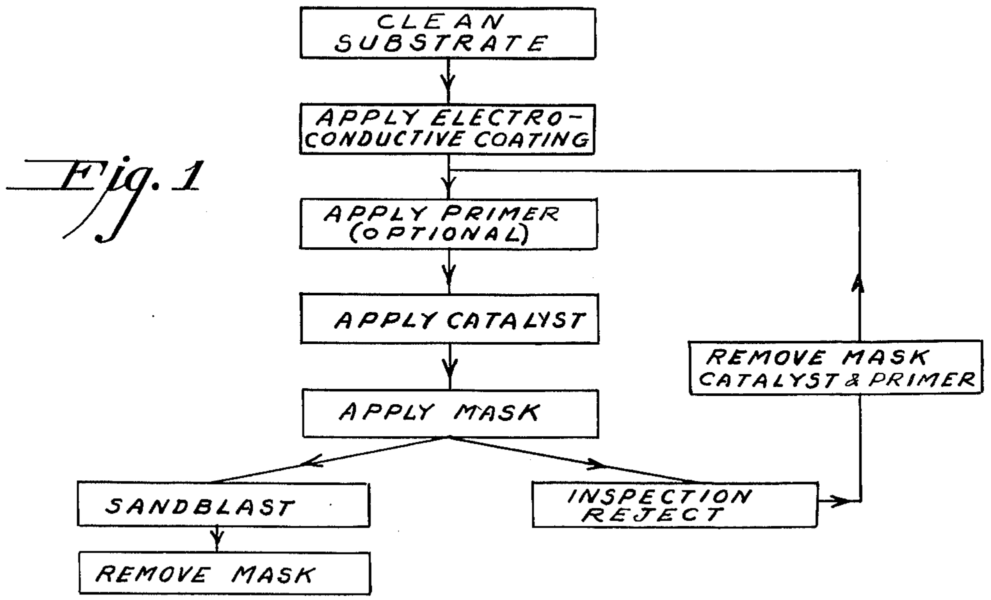
FIG. 1 is a flow diagram illustrating the steps of the method of this invention.
Figure 2:
FIGS. 2–6 are cross sectional views of a thin non-conductive substrate illustrating the various steps in the formation of a patterned resistance element thereon, in accordance with the method of this invention.

FIGS. 2–7 illustrate the various steps of the method and the resultant product of this invention. Referring to FIG. 2, the first step of the method in accordance with this invention is illustrated by providing a non-conductive substrate 10, which has been cleaned by any suitable commercial cleaning method such as dipping in an ultra-sonically agitated bath of acetone, xylene or trichlorethylene.

Suitable substrate materials are glass, ceramics, plastics and the like. A continuous coating, 12, of an electroconductive material is thereafter applied to said substrate. The substrate and electroconductive coating materials, the method of cleaning the substrate and the method of applying the electroconductive coating are not critical elements of this invention.

Figure 3:
Figure 4:
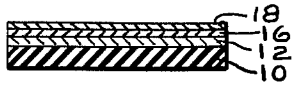
Figure 5:
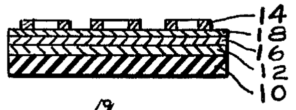

A mask suitable for the purposes of this invention is formed of a resilient synthetic resinous material such as for example, silicone rubber or the like and can by applied by various methods such as silk screening, spraying, and the like. In accordance with the method of this invention the mask is formed by applying uncatalyzed resin to a precatalyzed substrate. It has been found that the adhesion of said mask to said substrate can be improved by applying a suitable resin primer, although this is not an essential step of the method. Referring now to FIG. 3, when such improved adhesion is desired, a film 16, of a suitable resin primer is applied directly to the electroconductive coating 12, to which film 16, a layer 18, of a suitable resin catalyst is applied as illustrated in FIG. 4. Referring to FIG. 5*a*, mask 14, of an uncatalyzed resilient synthetic resinous material is then silk screened on said layer 18, said mask corresponding in shape to the desired electroconductive pattern. The mask material is then allowed to cure after which curing it is firmly adhered to said substrate.

Figure 6:
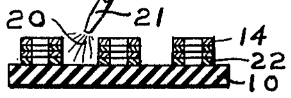
Figure 7:
FIG. 7 is a cross section of a thin wafer resistor having a patterned resistance element formed on one flat surface of the substrate thereof in accordance with this invention.

FIG. 6 illustrates the masked surface of the unit so formed being sandblasted by a stream 20, of suitably sized particles of aluminum oxide or the like, from a suitable sandblasting means 21. This sandblasting removes all of the materials surrounding said mask, including a portion of said electroconductive coating, thereby partly uncovering the substrate. The remainder of said electroconductive coating, forming the patterned electroconductive coating 22, is protected during said sandblasting step by the resilient mask 14. After the sandblasting step, the mask together with any remaining primer or catalyst covered by it is removed by suitable means, leaving the patterned electroconductive coating 22 firmly adhered to said substrate 10 as illustrated in FIG. 7.

Figure 8:
FIG. 8 is a cross section of a thin wafer resistance device having a patterned resistance element formed on each flat surface of the substrate thereof in accordance with this invention.

FIG. 8 illustrates another embodiment of this invention where two patterned electroconductive coatings 24 and 26, are formed on a non-conductive substrate 28, one on each flat surface thereof, by duplicating the method hereinabove described either concurrently or successively.

Figure 9:
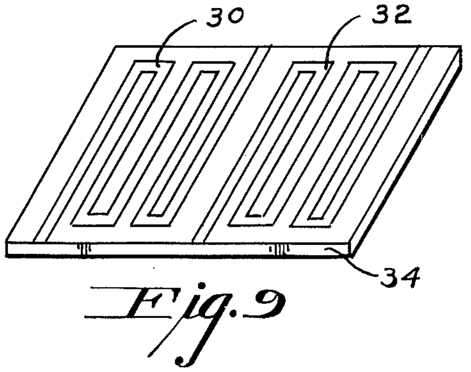
FIG. 9 is an oblique view of a thin wafer resistance device having two patterned resistance elements formed on one flat surface of the substrate thereof in accordance with this invention.

FIG. 9 illustrates still another embodiment of this invention where two patterned electroconductive coatings 30 and 32, are formed on one surface of a non-conductive substrate 34, in accordance with the method hereinabove described.

It can be readily seen that any number of patterns of any configuration and arrangement may be formed on one or both flat surfaces of a substrate in accordance with this invention.

Resilient synthetic resinous materials suitable for the present purposes are elastomers such as silicone rubbers, vinyl chlorides, chloroprenes and the like. Particularly suitable resins are the well known room temperature vulcanizable (RTV) silicone rubbers. It is important that such materials be resilient, that is that they have rubber-like properties, so that they may absorb the bombardment by the sandblast particles without being removed, and that the materials do not react or combine with or otherwise deleteriously effect the coating to be patterned. It should be noted that by employing the method of this invention it is possible to approach 100 percent yield, since each component may be easily inspected after the mask is applied and reprocessed if the mask is found to be defective in any way.

A typical example of one method of carrying out the present invention is illustrated by the following description. A $\frac{5}{16}''$ square wafer of hot pressed alumina, having a thickness of about 0.010″ may be suitably cleaned by dipping in an ultrasonically agitated trichlorethylene bath and a continuous electroconductive coating comprising tin oxide with 3% antimony oxide is applied to each of its flat surfaces. This coating is of the type described in the heretofore noted Mochel patent.

Thereafter a layer of stannous octoate, a silicone resin catalyst, is applied to said electroconductive coatings. A mask of silicone rubber having the shape of the desired electroconductive pattern is then silk screened on each of the precatalyzed flat substrate surfaces and allowed to cure under room conditions. After curing, a stream of aluminum oxide powder, having an approximate particle size of about 27 microns, is directed to both flat surfaces of the unit so formed. All of the materials surrounding said masks and not covered by them are removed, exposing the substrate material. The masks together with any remaining catalyst are then removed by ultrasonic cleaning in trichlorethylene.

It is obvious that the method of this invention may be readily employed for patterning any type of film not necessarily electroconductive, as well as multiple films or even the substrate itself. For example, a series of condensers may be formed by suitably masking a plurality of alternating layers of conductive and non-conductive films. A decorative or the like pattern, may be formed on the substrate itself by, for example, sandblasting the substrate around a mask formed by the method of this invention.

Although the present invention has been described with respect to specific details of certain embodiments thereof, it is not intended that such details be limitations upon the scope of the invention except insofar as set forth in the following claims.

What is claimed is:

1. A method of forming a patterned electroconductive coating on a substantially non-conductive substrate comprising the steps of forming a substantially continuous film of an electroconductive material on said substrate, applying a substantially continuous layer of a synthetic resin catalyst to said film, applying to said layer a mask of uncured and uncatalyzed synthetic resinous material which is adapted to be cured by said catalyst to a resilient masking layer corresponding in shape to the desired pattern of said electroconductive coating, removing that portion of said film surrounding said mask and thereafter removing said mask.

2. A method of forming a patterned electroconductive coating on a substantially non-conductive substrate comprising the steps of forming a substantially continuous first film of an electroconductive material on said substrate, applying a substantially continuous second film of a synthetic resin primer to said first film, applying a substantially continuous layer of a synthetic resin catalyst to said second film, silk screening on said layer a mask of uncured and uncatalyzed synthetic resinous material which is adapted to be cured by said catalyst to a resilient masking layer corresponding in shape to the desired pattern of said electroconductive coating, removing that portion of said first film surrounding said mask by sandblasting and thereafter removing said mask.

3. The method of claim 2 where said resilient synthetic resinous material is silicone rubber.

4. A method of forming a wafer resistance device comprising a thin, flat, non-conductive substrate and at least one resistance element adhered to one flat surface of said substrate comprising the steps of forming a substantially continuous first film of an electroconductive material on said flat surface, applying a substantially continuous second film of a synthetic resin primer to said first film, applying a substantially continuous layer of a synthetic resin catalyst to said second film, silk screening on said layer a mask of uncured and uncatalyzed synthetic resinous material which is adapted to be cured by said catalyst to a resilient masking layer corresponding in shape to desired resistance element configuration and arrangement, removing that portion of said first film surrounding said mask by sandblasting, and thereafter removing said mask.

5. The method of claim 4 where said resilient synthetic resinous material is silicone rubber.

6. A method of forming a resistance device comprising a thin, flat, non-conductive substrate and at least one resistance element adhered to one flat surface thereof comprising the steps of forming a substantially continuous film comprising tin oxide on said flat surface, applying a substantially continuous layer of stannous octoate to said film, silk screening on said layer a mask of uncured and uncatalyzed silicone rubber which is adapted to be cured by said stannous octoate to a resilient masking layer corresponding in shape to the desired resistance element configuration and arrangement, removing that portion of said first film surrounding said mask by sandblasting, and thereafter removing said mask.

7. A method of forming a resistance device comprising a thin, flat, non-conductive substrate and at least one resistance element adhered to one flat surface thereof comprising the steps of forming a substantially continuous film comprising tin oxide on said flat surface, applying a substantially continuous second film of a synthetic resin primer to said first film, applying a substantially continuous layer of stannous octoate to said second film, silk screening on said layer a mask of uncured and uncatalyzed silicone rubber which is adapted to be cured by said stannous octoate to a resilient masking layer corresponding in shape to the desired resistance element configuration and arrangement, removing that portion of said first film surrounding said mask by sandblasting, and thereafter removing said mask.

References Cited by the Examiner

UNITED STATES PATENTS

| | | | |
|---|---|---|---|
| 2,850,409 | 9/1958 | Boicey et al. | 117—212 |
| 2,861,911 | 11/1958 | Martin et al. | 117—212 |
| 2,885,601 | 5/1959 | Pessel | 117—212 |
| 2,919,366 | 12/1959 | Mash | 117—212 |

| | | | |
|---|---|---|---|
| 2,960,417 | 11/1960 | Strother | 117—212 |
| 3,032,433 | 5/1962 | Lewis et al. | 117—38 |
| 3,055,776 | 9/1962 | Stevenson et al. | 117—212 |
| 3,083,118 | 3/1963 | Bridgeford. | |

OTHER REFERENCES

Ellis: "The Chemistry of Synthetic Resins," 2, published by Reinhold Publishing Corporation, N.Y., 1935 (p. 980 relied on).

JOSEPH B. SPENCER, *Primary Examiner.*

RICHARD D. NEVIUS, *Examiner.*